(12) United States Patent
Nyu et al.

(10) Patent No.: US 6,380,767 B1
(45) Date of Patent: Apr. 30, 2002

(54) CONNECTION CONTROL CIRCUIT

(75) Inventors: Takayuki Nyu, Tokyo; Kohichiro Suzuki, Kanagawa, both of (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 09/697,455

(22) Filed: Oct. 26, 2000

(30) Foreign Application Priority Data

Oct. 27, 1999  (JP) ............................................ 11-306039

(51) Int. Cl.[7] .............................. H03B 1/00; H03K 3/00
(52) U.S. Cl. ........................... 327/108; 327/379; 327/1; 326/21
(58) Field of Search ................................ 327/108, 379, 327/1; 326/21; 375/340; 455/204–206

(56) References Cited

U.S. PATENT DOCUMENTS 5,384,773 A  * 1/1995 Olnowich et al. .......... 370/360
5,864,677 A  * 1/1999 Dent .......................... 375/340

FOREIGN PATENT DOCUMENTS

| JP | 57011581 | 1/1982 |
| JP | 07043456 | 2/1995 |
| JP | 08251135 | 9/1996 |
| JP | 11098160 | 4/1999 |

OTHER PUBLICATIONS

"1394 Trade Association Power Specification Part 2: Suspend/Resume Implementation Guidelines" Oct. 5, 1999, 1934 Trade Association, Santa Clara, USA XP002156050, Revision 1.0 1394 TA Spec 1999001–2 *p. 25–p. 26; figures 9–1, 9–2* *p. 1–p. 25*.

"1394TA IICP Specification for the Instrument & Industrial Control Protocol" Oct. 8, 1999, 1394 Trade Association, Santa Clara, USA XP002156051IICP version 1.0 1394TA document 1999016 *p. 77–p. 93 ** p. 1–p. 93 *.

* cited by examiner

Primary Examiner—Terry D. Cunningham
Assistant Examiner—Long Nguyen
(74) Attorney, Agent, or Firm—Dickstein Shapiro Morin & Oshinsky LLP

(57) ABSTRACT

A connection control circuit is provided to guarantee a high quality of port-to-port connection service by enabling to maintain the suspended state even when a disparity exists in the pulse widths of the envelope signals of the tone signals between the sender and receiver, exemplified by a receiver tone pulse width being wider than a sender tone pulse width. Connection control is achieved by providing a signal correction circuit between the receiver circuit of a port that receives incoming signals from an opposing port through a transmission line and a connection state managing machine that manages connection between the ports. The signal correction circuit corrects the tone pulse width of an envelope-signal generated from the incoming tone signal by broadening the pulse width so as to conform to a tone signal having the pulse width specified by own connection state managing machine.

7 Claims, 16 Drawing Sheets tone psd sgd

CONNECTION CONTROL CIRCUIT

BACKGROUND OF THE INVENTION

1. Field of the Invention

The present invention relates to a connection control circuit for connecting two devices through a serial interface, standardized according to IEEE Standard for a High Performance Serial Bus, IEEE Std. 1394-1995, for example.

This application is based on a Japanese Patent Application No. Hei 11-306039 (unpublished), the content of which is incorporated herein by reference.

2. Description of the Related Art

Recently, considerations have been given to forming a network by connecting personal computers PCs, peripheral devices or audio-visual (AV) devices through serial interfaces (for example, according to IEEE Standard for a High Performance Serial Bus, IEEE Std 1394-1995, referred to as 1394-standard hereinbelow). FIG. 11 shows a configuration of a network connected to four devices (referred to as nodes hereinbelow).

As can be seen in FIG. 11, a network is formed by interconnecting the nodes A, B, C, D by way of ports (1), (2) and (3). In the physical layer of each node A–D, there are provided a state arbitration machine 101 for initializing bus lines and securing the transmission right for bus lines, and a connection state managing machine (indicated by 5 in FIG. 12) provided in each port for managing port-to-port connections.

Each port (1)–(3) functions as a connection control circuit, and is comprised by a sending code processing circuit 1, a sending circuit 2, a receiving circuit 3, a receiving code processing circuit 4 and a connection state managing machine 5, as shown in FIG. 12. FIG. 12 shows a connection between the ports of two opposing nodes A, D of a transmission line, and in this case, port (3) of node A is connected to port (1) of node D.

Here, the operation of port-to-port connection within a given port is specified by a respective connection state managing machine 5 provided in each of the ports (1)–(3).

FIG. 13 shows a current state of the connection state managing machine 5 and its transition paths of connecting states.

First, when there is no node connection to the ports, the connection state managing machine 5 is in the disconnected state P0. While the machine is in state P0, if a new connection is made to its port, the state shifts to the resuming state P1, and the sending code processing circuit 1 and the receiving code processing circuit 4 inside the port are initialized. After the initialization step, the state shifts to the active state P2.

If a disconnection of a port is detected, the connection state managing machine 5 shifts to the disconnected state P0 via the suspended state P5. Also, when the command is received from the upper layer to suspend a port, the state shifts from the active state P2 to the suspended state P5. Further, when a port-disable command is received from the upper layer, the state shifts to the disabled state.

The disconnected state P0 means physical and logical non-connections, and active state P2 means physical and logical connections. The suspended state P5 means a physical connection but no logical connection, and the disabled state P6 means that the circuits are stopped within the port and that neither physical nor logical connection has been detected.

The manner of detecting the physical connection and logical connection is different depending on the type of serial-bus interfaces used to make the connection, i.e., whether the connection is the DC (direct current) coupling system (specified by P1394a Draft Standard for a High Performance Serial Bus) or the AC (alternating current) coupling system (specified by P1394b Draft Standard for a High Performance Serial Bus).

In the case of the DC coupling system, determination of physical and logical connections are made by detecting the voltage levels. The present invention is concerned with the AC coupling system so that detailed explanation of DC coupling system is omitted. The method of detecting physical and logical connections in the AC coupling system will be explained in the following.

In the AC coupling system, the physical connection is detected by utilizing a connection managing control signal called a tone signal. As shown in FIG. 14, a tone signal is a on/off modulated signal operating at a carrier clock frequency of 50 MHz with a period of 42.666 ms. Tone signals are transmitted when the port is either in the disconnected state P0 or in the suspended state P5.

Only the envelope-signal part of the tone signal received by the receiver side is output from the receiving circuit 3 as sgd-signal (meaning signal detected). Upon receiving the tone signal, the connection state managing machine 5 recognizes that a physical connection has been made to its port based on the receipt of the sgd-signal.

On the other hand, when the nodes are connected to each other and both ports are in the active state P2 (i.e., logically connected), signals from the state arbitration machine 101 of each node are transmitted to the sending code processing circuit 1 in each port, and a continuous signal is output from the sending circuit 2. Here, a continuous signal means a random signal containing no long strings of '0s' or '1s', such that '0' and '1' are output in a ratio of 1:1 within a specific interval.

When the continuous signal is received by the receiver side, sgd-signal becomes fixed at '1'. When this state is detected, the connection state managing machine 5 recognizes that a logical connection is being made.

For the purpose of explaining the actions of the connection state managing machine 5 when it receives a tone signal or a continuous signal, it is assumed that the port is currently in the suspended state P5. When the connection state managing machine 5 is in the suspended state P5, and a tone signal is received, the current state is maintained, but if a continuous signal is received, the connection state managing machine 5 shifts to the resuming state P1. When neither the tone signal nor the continuous signal is being received, it is determined that the cable is not connected, and it shifts to the disconnected state P0.

FIGS. 15A and 15B show flowcharts of the operations of the connection state managing machine 5 when the port starts from the suspended state P5. FIG. 15A shows the process of latching the envelope-signal sgd (the first signal) and producing an sdd-signal (meaning sd_detected, the second signal), and FIG. 15B shows the process of setting '1' in the rok-signal (meaning receive OK) when a continuous signal is detected. Processes described in FIGS. 15A, 15B are carried out concurrently. The operations shown in FIGS. 15A, 15B will be explained further in the following.

When the sgd-signal is received during the A-interval shown in FIG. 14, because sgd is set to '0', sdd is also '0' and the processing loop L51 is carried out (step S111, S112). In the B-interval in the meantime, because sgd='1' (step S101), latched signal sdd is also '1' (step S102, processing 1). Because the latched signal sdd is set to '1', the sdd-signal passes through the loop processing L51 (shown in FIG. 15B) and loop processing L52 (step S113, S114) is carried out until the count 1 reaches a value of Tc. Here, Tc represents a count value corresponding to a time interval (666 μs) during which tone signal is '1'.

After an interval of Tc, sdd-signal is reset to '0' (step S115, processing 2). And, because a time interval Tc has elapsed since sgd was set to '1', sgd-signal is reset to '0', and therefore, sdd-signal maintains the reset state at '0' (step S115, processing 2), so that sdd-signal returns to the initial processing by way of the return path R51 (step S116). While the tone signals are received, the above process is repeated and the port is maintained in the suspended state P5.

On the other hand, if a continuous signal is received from the opposing port, sgd-signal is fixed at '1' (FIG. 16, interval C). In this case, sgd='1' and sdd-signal is set to '1' by processing 1 (FIG. 15A, step S101, S102). After the sdd-signal is set to '1' (step S112, S113, S114), and after waiting for the interval Tc, sdd-signal is reset to '0' (step S115, processing 2).

Even though sdd-signal is reset to '0', because sgd-signal is fixed at '1' while the port is receiving continuous signal, sdd-signal is again set to '1' by processing 1 (step S102). Therefore, after the sdd-signal is set to '1' and continuing to count for the interval Tc (loop L53), the sdd-signal is reset to '0', and rok signal is set to '1'. By carrying out these steps, the port is shifted from the suspended state P5 to the resuming state P1.

However, the connection control methodology according to the related technology described above presents the following problems.

As shown in FIG. 17, when the fall delay time fd of the receiving circuit 3 is larger than the rise delay time rd of the envelope-signal (sgd-signal) of the tone signal, the pulse width of sgd-signal can sometimes be wider than the pulse width (Tc) of the tone signal. When the port is in the suspended state P5, tone signals are being exchanged between the opposing connected ports, so that if the pulse width of the sgd-signal becomes wider than the interval Tc, the connection state managing machine 5 erroneously recognizes the tone signal as the continuous signal, thereby setting the rok signal to '1'. The result is that the ports are shifted from the suspended state P5 to the resuming state P1, resulting that the suspended state cannot be maintained.

SUMMARY OF THE INVENTION

It is, therefore, an object of the present invention to provide a connection control circuit (port), according to the 1394 standard serial interface connection, so as to guarantee the port connection service by maintaining the suspended state of a port receiving a tone signal in its receiving circuit, even when the pulse width of the envelope-signal of the tone signal output from the receiving circuit of the receiving port is wider than the pulse width of the tone signal transmitted from the opposing sending port.

To achieve the object, the present connection control circuit is comprised by an envelope-signal generation section for receiving an incoming signal sent from a device at an opposing end of a transmission line and generating an envelope-signal in accordance with the incoming signal; a discrimination section for discriminating, based on the envelope-signal, whether the incoming signal is a continuous signal or a connection managing signal by referencing a specific discrimination interval that is longer than a pulse width of the envelope-signal of a connection managing signal output from the envelope-signal generation section; and a connection managing section for shifting a state of the connection control circuit according to a type of incoming signals determined by the discrimination section.

The connection control circuit having the structure described above does not mistakenly recognize a connection control signal output from a sender port as a continuous signal even if a pulse width of the envelope-signal produced from the connection control signal in the receiver port is wider than a pulse width of the sender's connection control signal. The result is that the connection control circuit that is currently in the suspended state can be maintained in the suspended state by the connection managing section.

DETAILED DESCRIPTION OF THE PREFERRED EMBODIMENTS

Preferred embodiments will be presented in the following with reference to the drawings.

[Embodiment 1]

Figure 1:
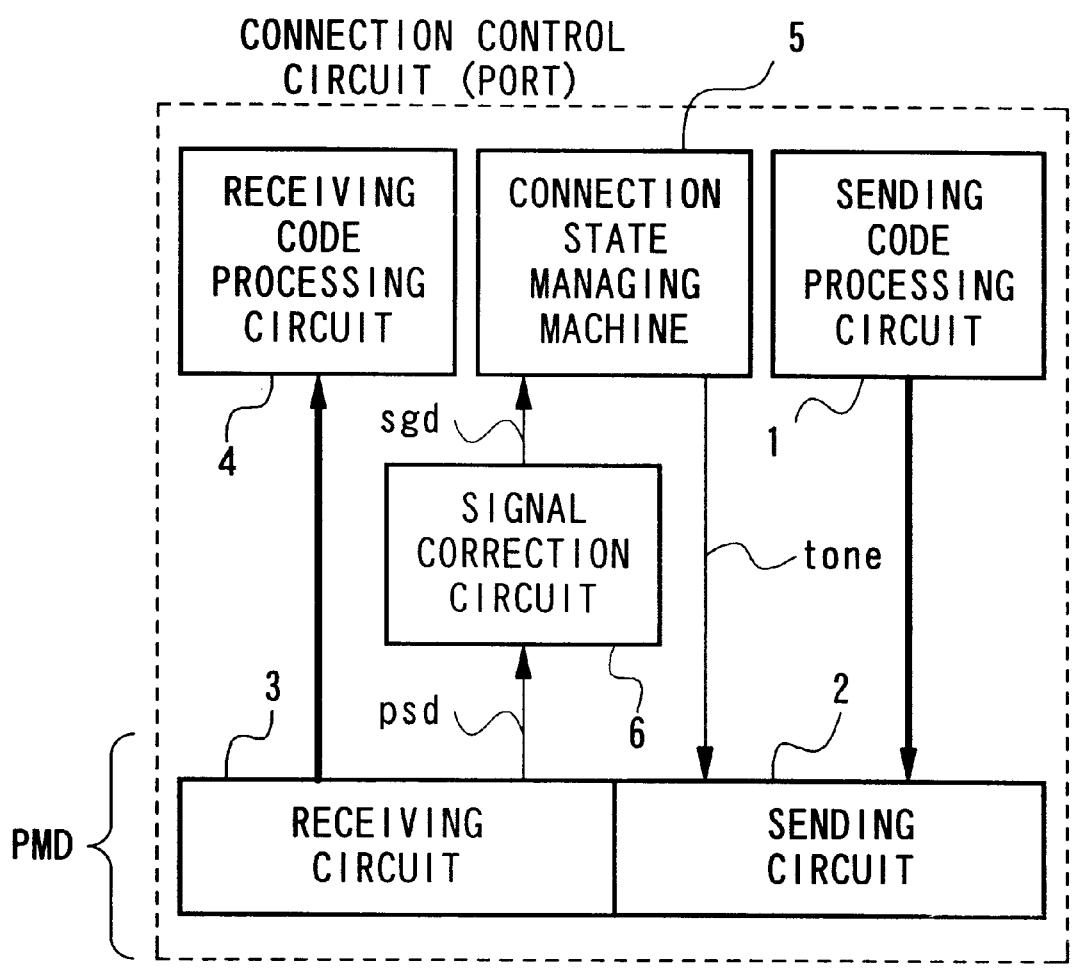
FIG. 1 is a block diagram of a configuration of the connection control circuit (port) in Embodiment 1 of the present invention.

FIG. 1 shows a block diagram of the configuration of the connection control circuit (or port hereinbelow) in Embodiment 1.

Figure 11:
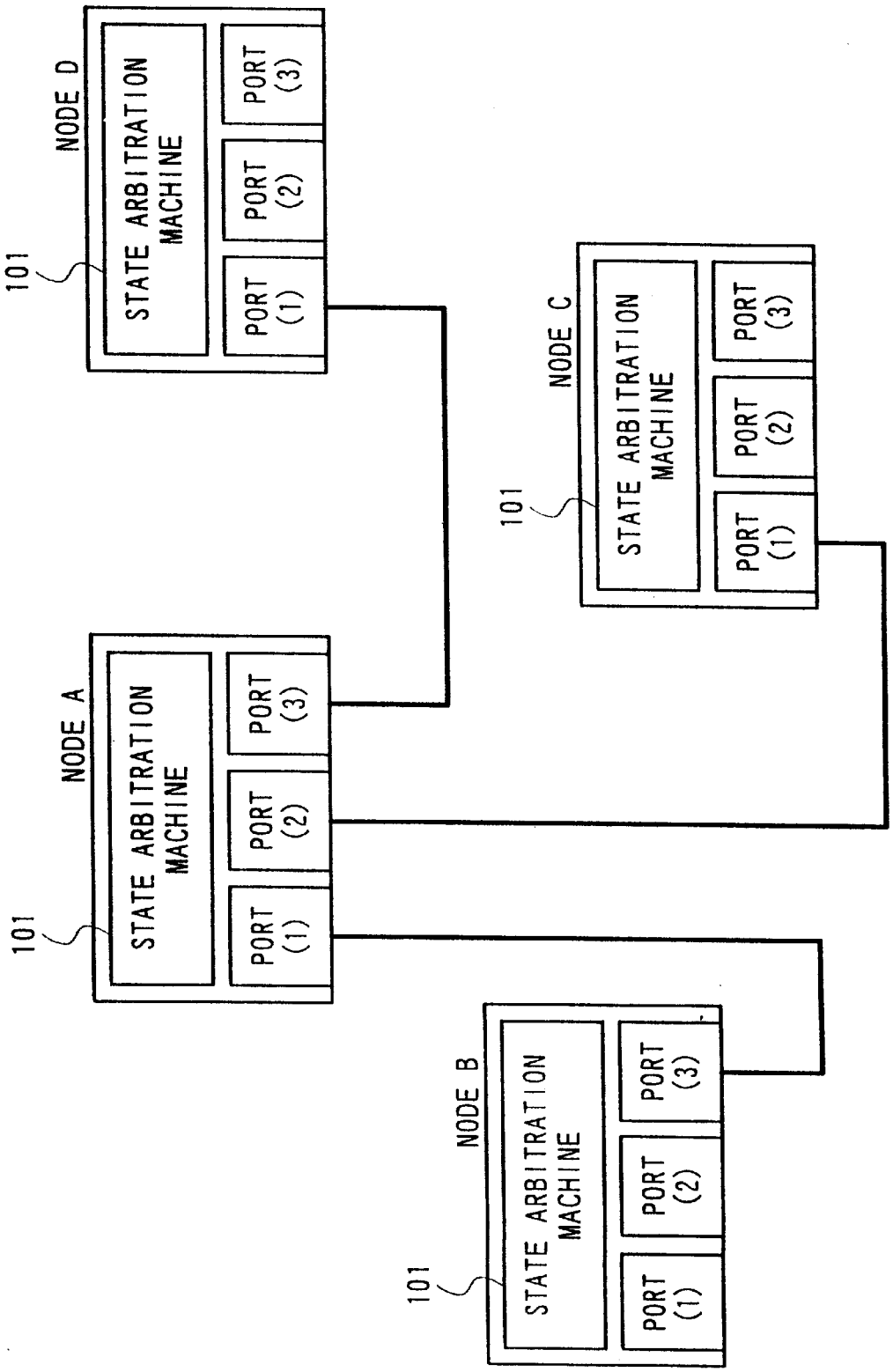
FIG. 11 is a block diagram showing a plurality of nodes connected by serial interfaces.
Figure 12:
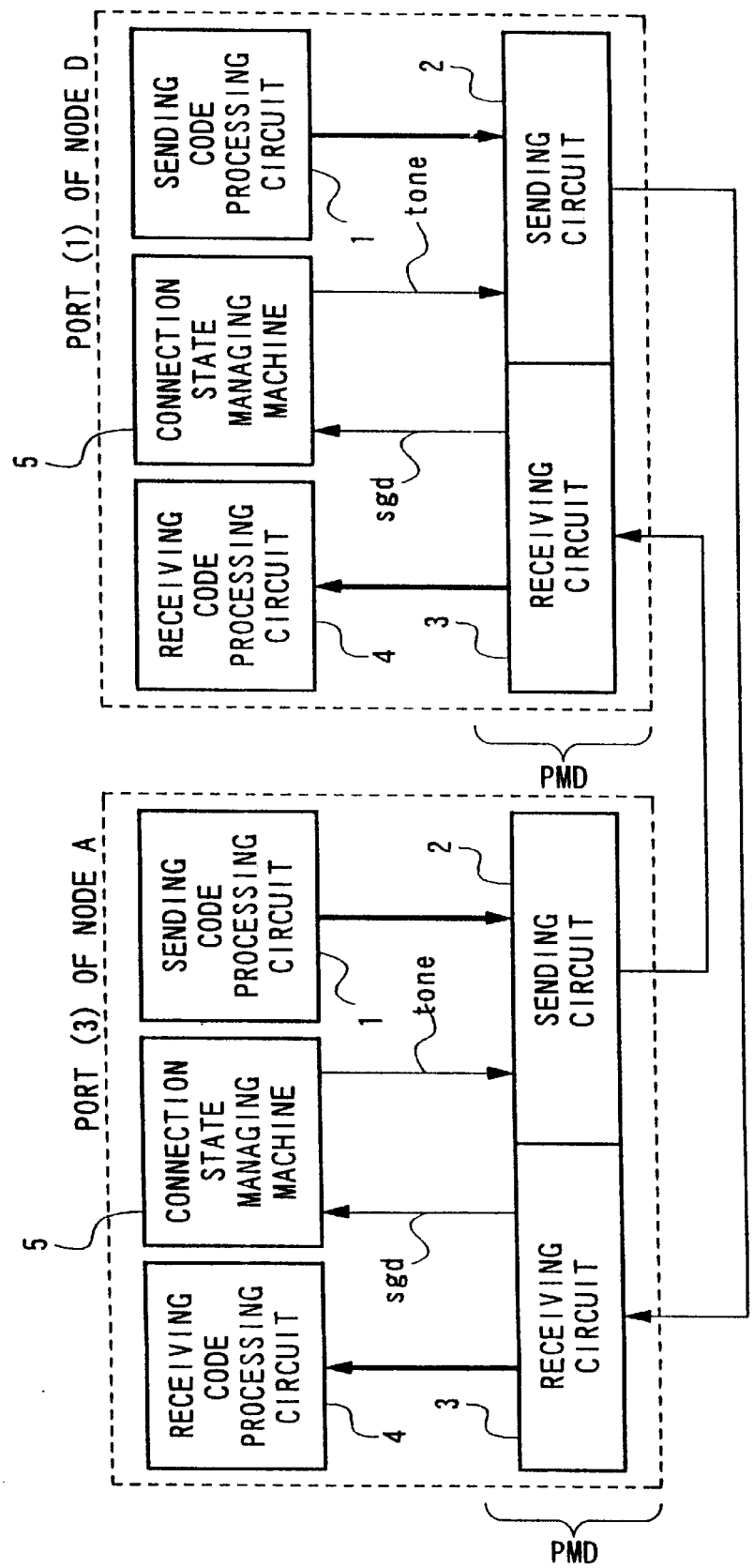
FIG. 12 is a block diagram of port connections between two nodes according to a conventional technology.
Figure 13:
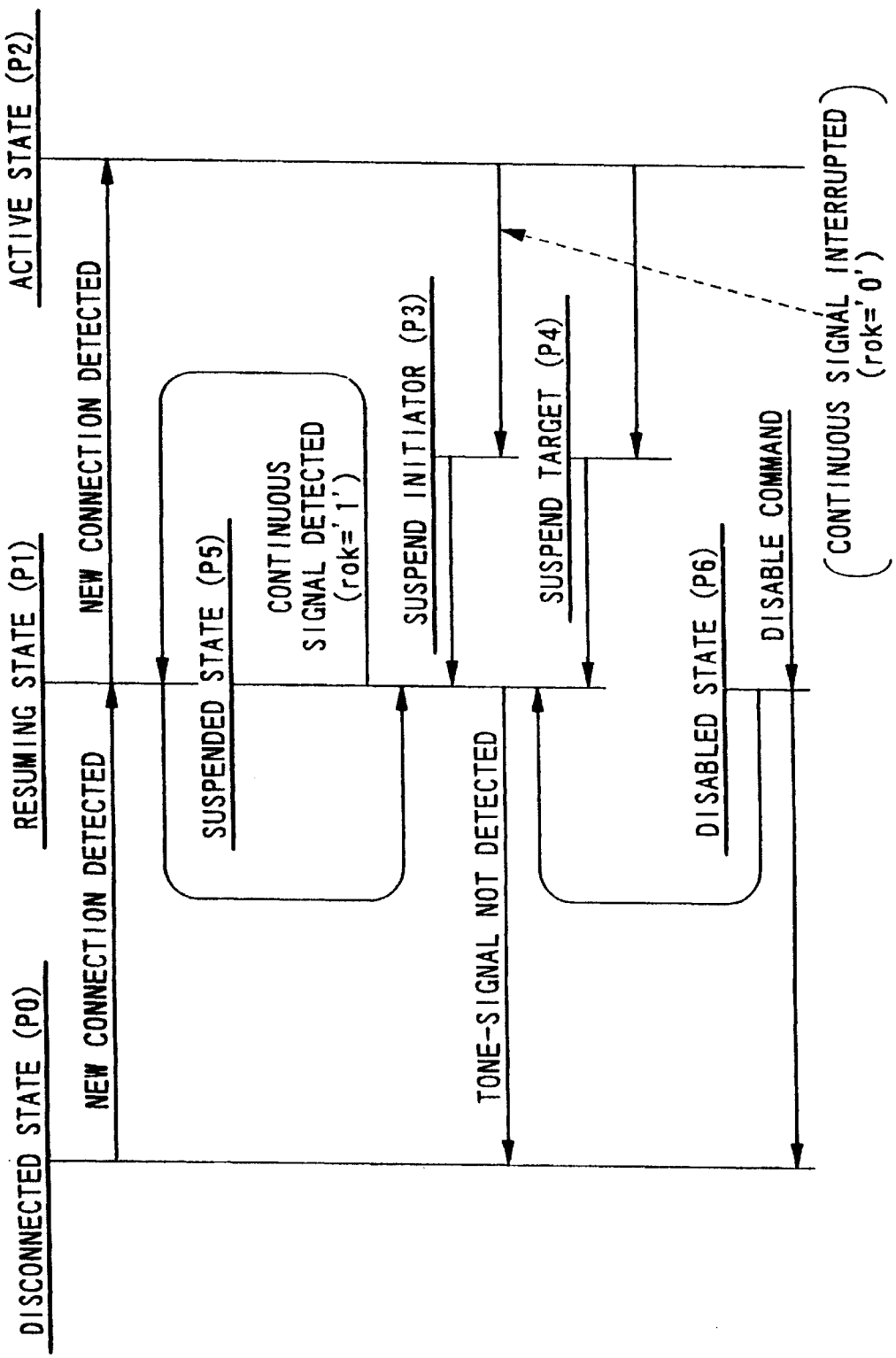
FIG. 13 is a diagram to explain the operation of the connection state managing machine 5 and shifting paths of the various states.
Figure 14:
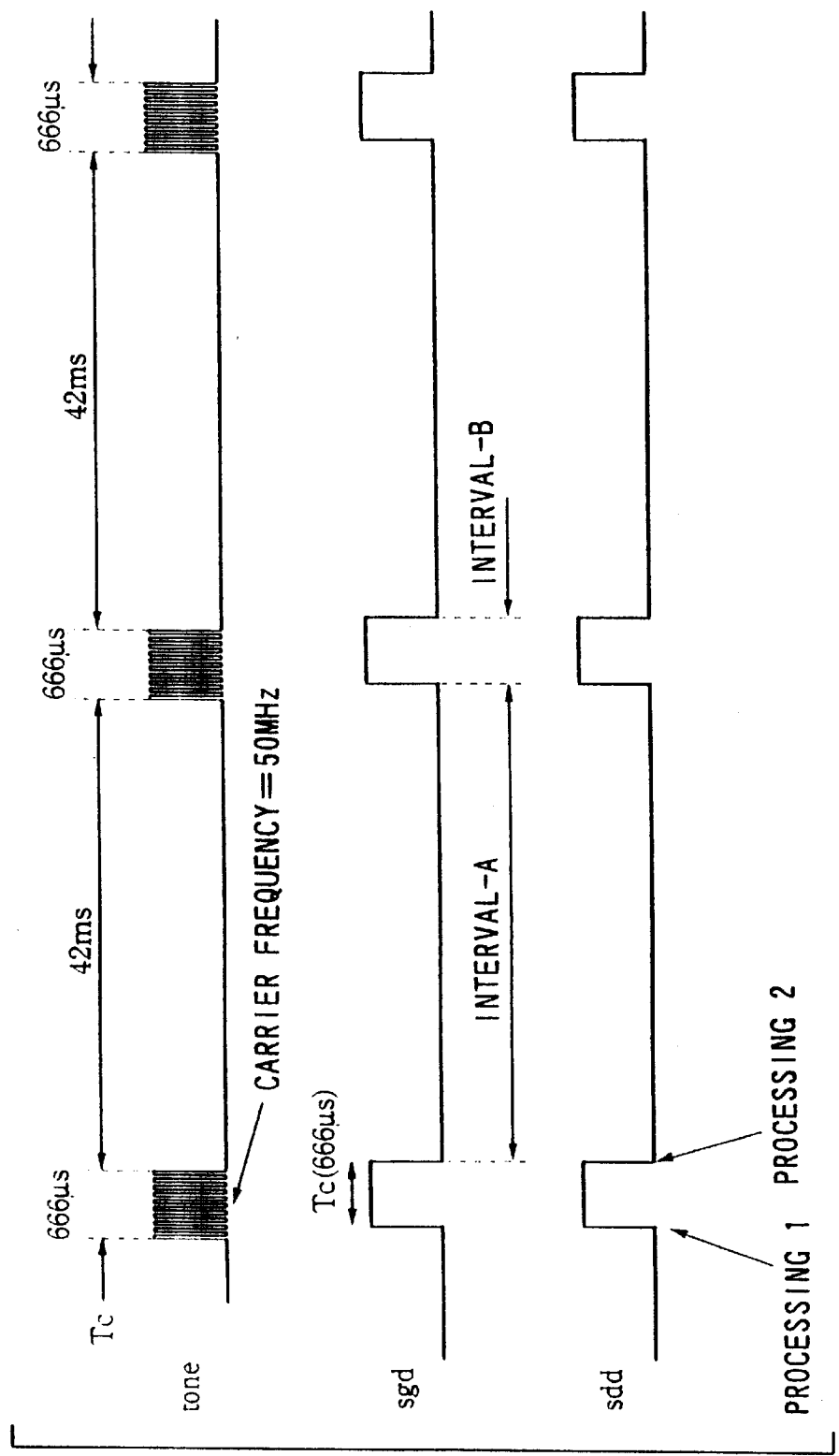
FIG. 14 is an illustration of the waveforms of tone-signals, sgd-signals and sdd signals along a chronological scale.

A port in the context of the present embodiment refers to individual ports contained within each of the nodes A–D shown in FIG. 11, and replaces the conventional ports used in the related technology shown in FIG. 12. The port in the present embodiment is comprised by: a sending code processing circuit 1; a sending circuit 2; a receiving circuit 3, a receiving code processing circuit 4; a connection state managing machine 5 and a signal correction circuit 6. Specifically, the present port has a feature that the signal correction circuit 6 is provided between the receiving circuit 3 for receiving signals from the transmission line and the connection state managing machine 5 for controlling the connections between the ports. The signal correction circuit 6 performs correction of a pulse width of the envelope-signals psd (pmd (physical media dependent)-sd) generated according to the received signals in the receiving circuit 3 received from the transmission line.

Here, the sending code processing circuit 1 is a circuit to perform code conversion of signals sent from the state arbitration machine 101 (refer to FIG. 11), which is an upper layer device, and transfers the converted signals to the sending circuit 2. The sending circuit 2 is a circuit for receiving signals from the sending code processing circuit 1 or the tone signals from the connection state managing machine 5, and outputting to the transmission line.

The receiving code processing circuit 4 sends received signals sent from the receiving circuit 3 to the upper layer device, i.e., state arbitration machine 101.

The connection state managing machine 5 not only outputs tone signals to the sending circuit 2 to recognize a connection to the physical connection between the ports but also receives corrected sgd-signals sent from the signal correction circuit 6. The signal correction circuit 6 corrects the envelope-signal psd sent from the receiving circuit 3 to corrected signals having desired characteristics, and outputs the corrected signals as sgd-signals to the connection state managing machine 5.

Figure 2:
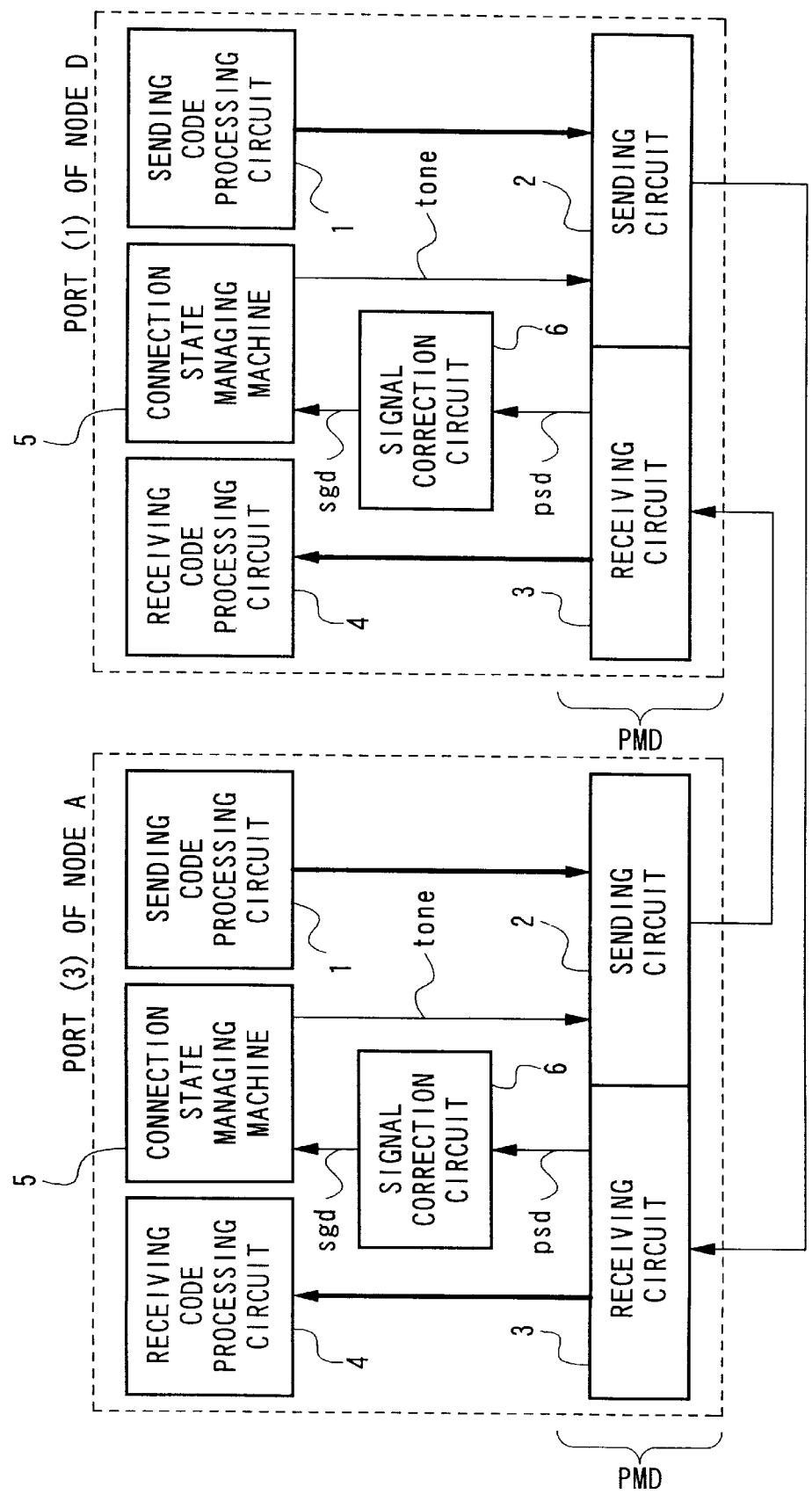
FIG. 2 is a block diagram of a connection between two nodes through the ports, each having a signal correction circuit shown in FIG. 1.

FIG. 2 shows an example of connecting two nodes using the present port having a signal correction circuit 6 in each port.

Next, the following is a description of the operation of the present port, when the pulse width of the envelope-signals psd output from the receiving circuit 3 in the receiving node is wider than the pulse width of the tone signals output from the sending node.

Figure 15A:
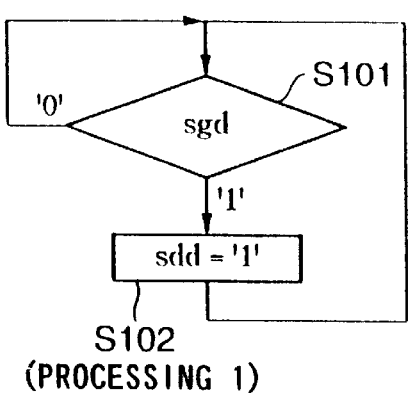
FIGS. 15A and 15B are flowcharts of a process carried out by the connection state managing machine 5 when a port is in the suspended state.
Figure 15B:
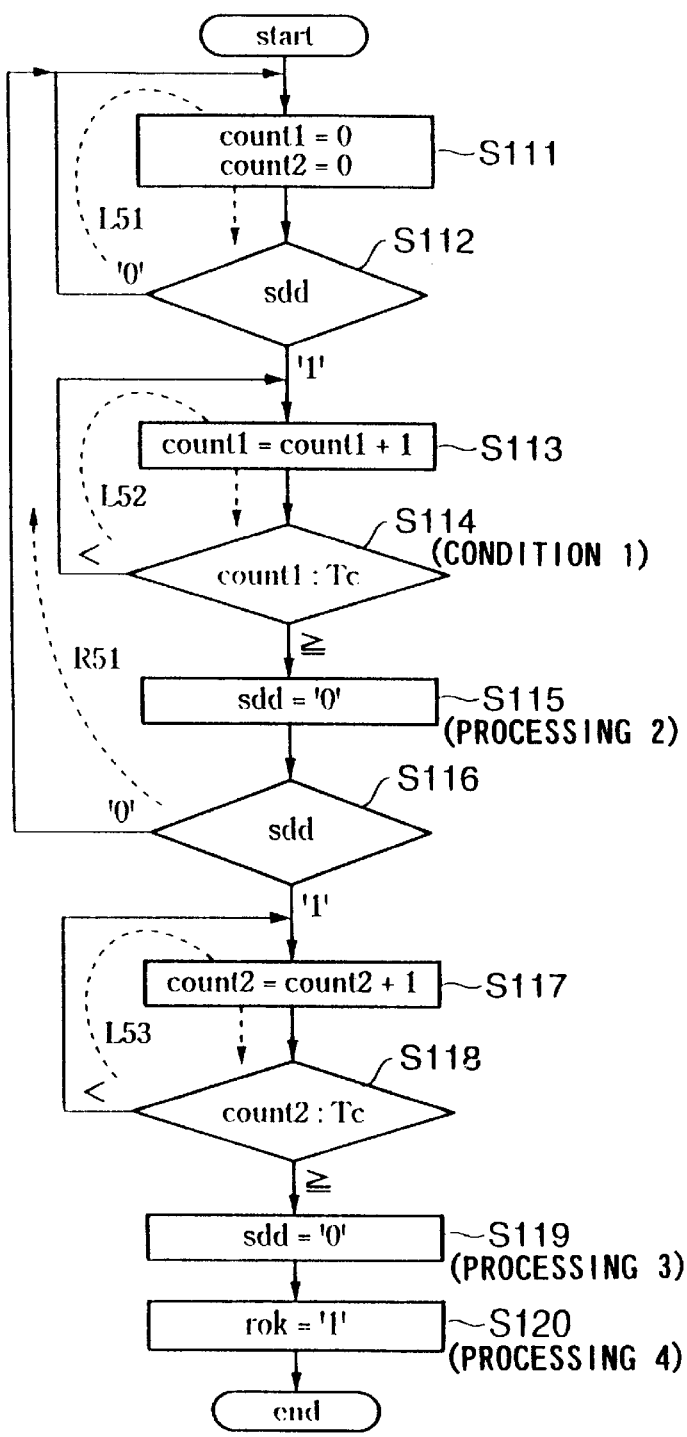
Figure 16:
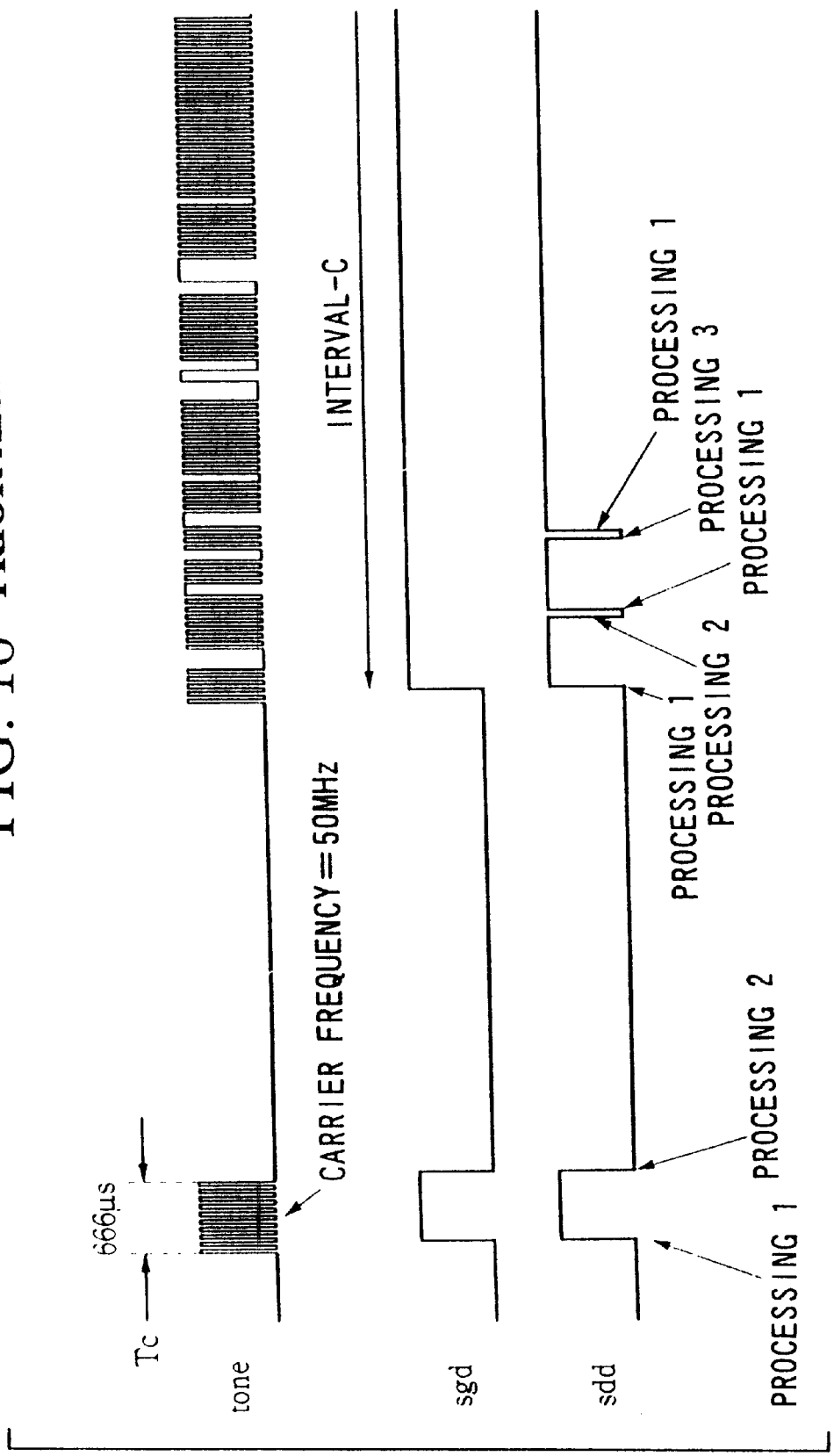
FIG. 16 is an illustration of the waveforms of sgd—and sdd-signals when the connection state managing machine shifts from the suspended state to the resuming state.
Figure 17:
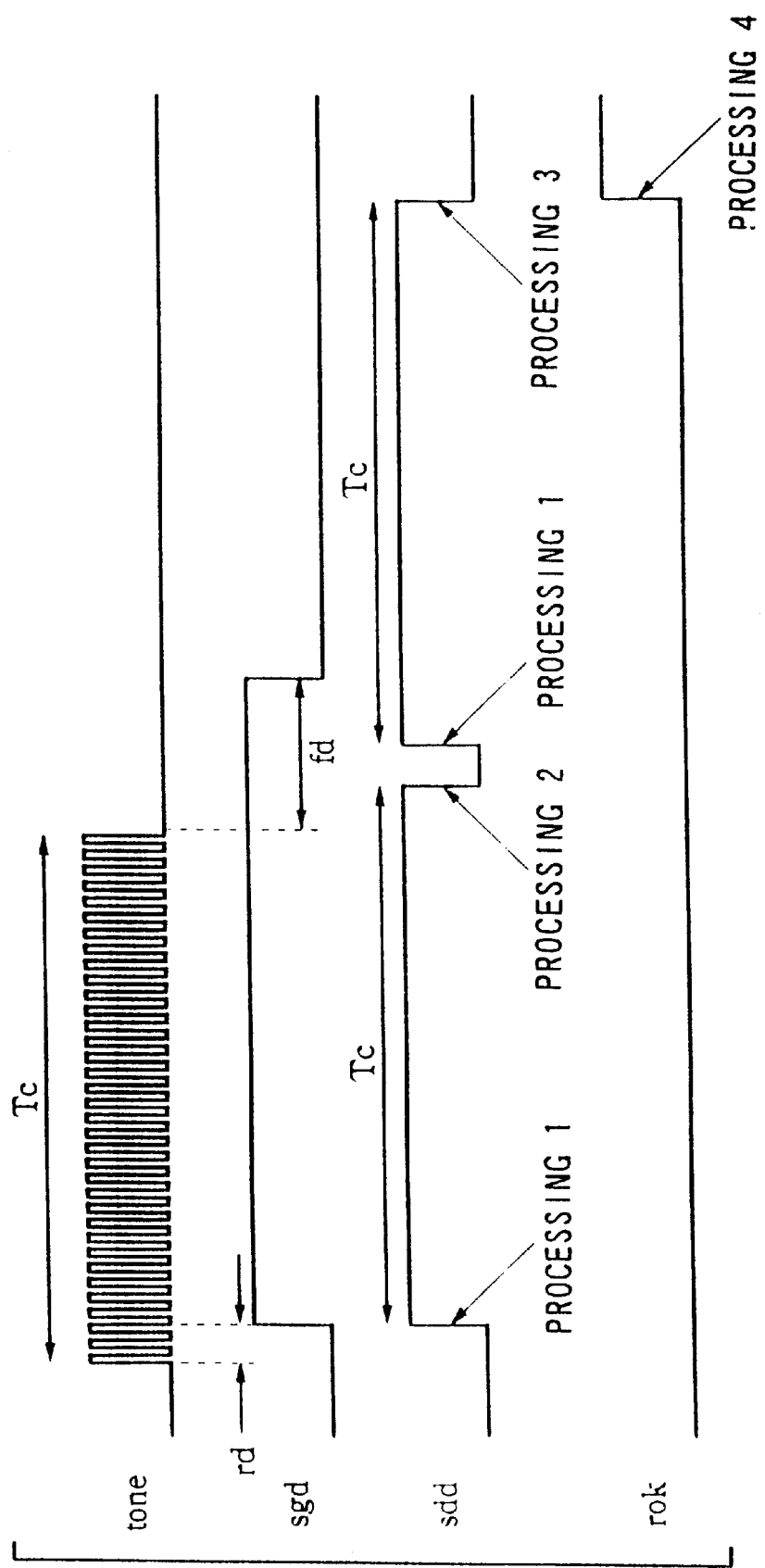
FIG. 17 is an illustration of the waveforms of tone signals, sgd-signals and sdd signals along a chronological scale to explain the problem encountered in the conventional connection state managing machine when the tone signals are being received.

When the port is in the suspended state P5, and the connection state managing machine 5 receives sgd-signal, it behaves in the manner depicted in the flowcharts shown in FIGS. 15A and 15B.

In the ports at the opposing ends of a transmission line, each connection state managing machine 5 is assumed to be in the suspended state P5. In such a case, these connection state managing machines 5 will be outputting tone signals, which are output through the respective sending circuits 2 to the transmission line.

Figure 3:
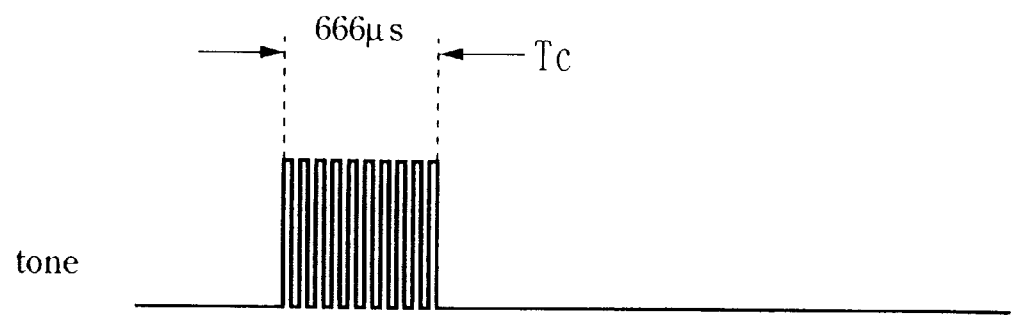
FIG. 3 is an illustration of the waveforms of the signals in Embodiment 1.
Figure 3:
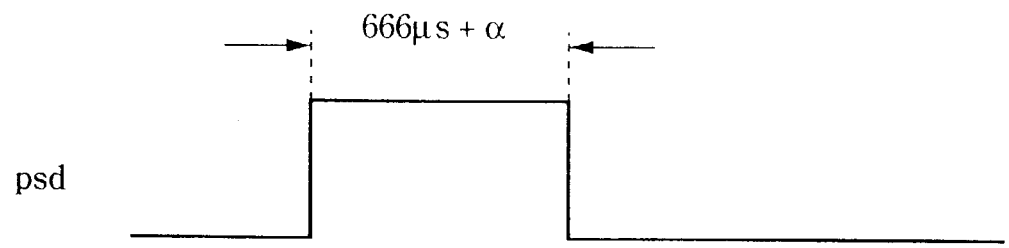
Figure 3:
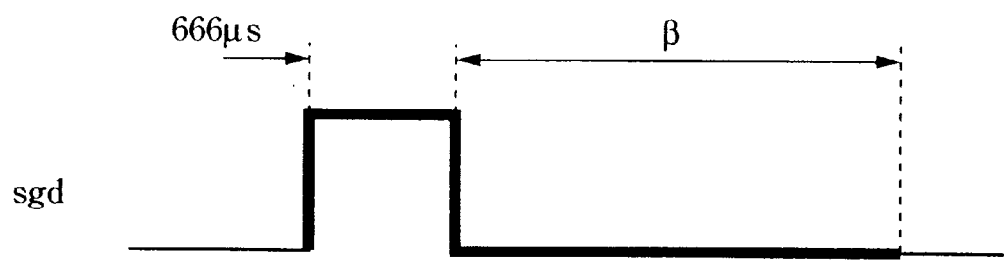

The receiving circuit 3 receiving the tone signal from the transmission line outputs an envelope-signal psd having a pulse width (666 $\mu$+$\alpha$), which is wider than the pulse width (666 $\mu$s=Tc) of the envelope-signal of the tone signal, as shown in FIG. 3. The envelope-signal psd input in the signal correction circuit 6 is replaced with a signal pattern that shows '1' during the interval Tc and '0' during an interval $\beta$.

According to the present connection control circuit, an incoming tone signal is corrected so that '1' is continued during the tone interval Tc, and this corrected signal is input as sgd-signal (envelope-signal) in the connection state managing machine 5. Therefore, it can be guaranteed that the sgd-signal will always be processed through the return path R51 as described in the flowchart shown in FIG. 15B so long as the tone signals are being received. The result is that rok-signal will not be set to '1' so that the connection state managing machine 5 is not erroneously shifted to the resuming state P1.

Next, the specific steps in the signal correction circuit 6 will be explained with reference to FIGS. 4 and 5.

Figure 4:
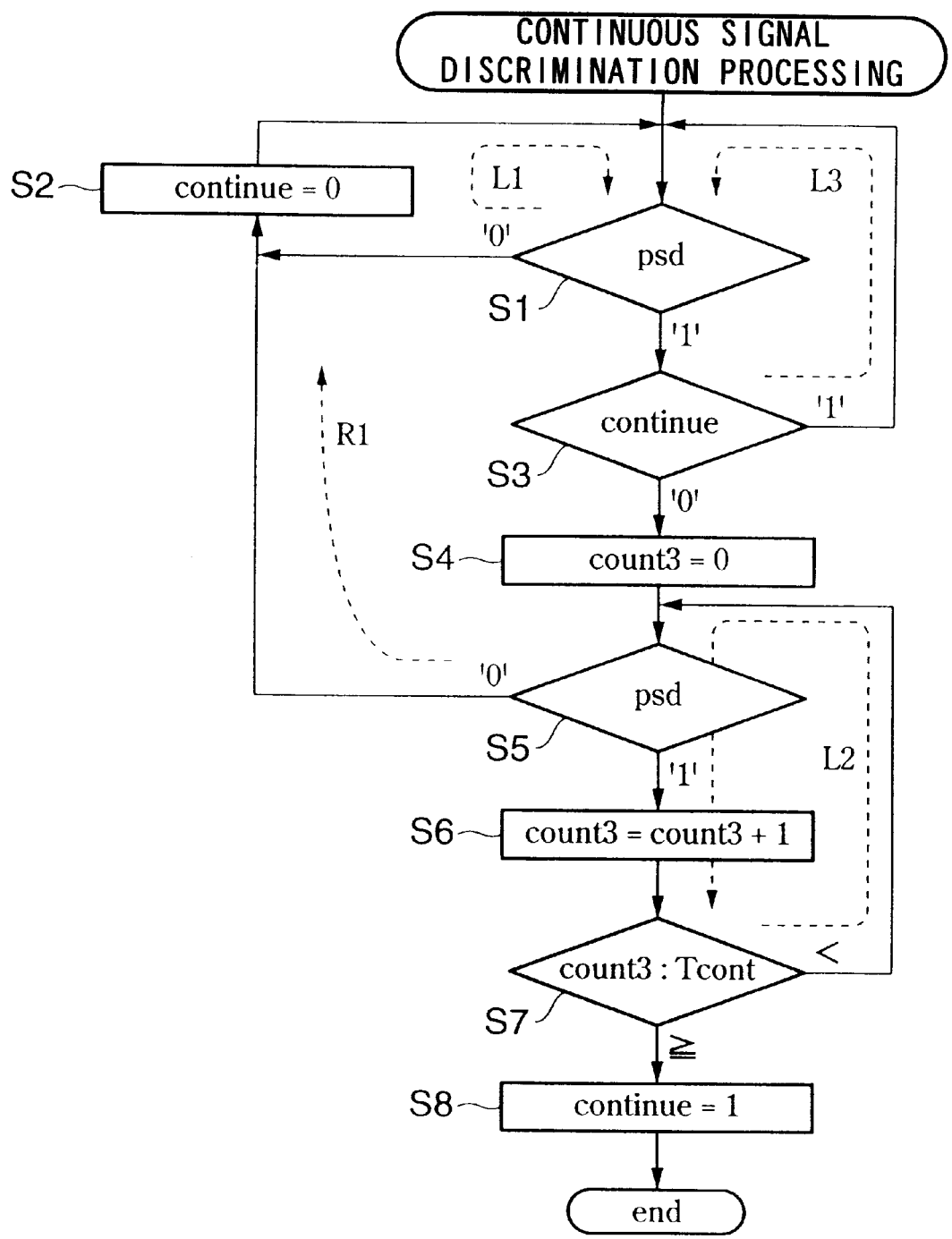
FIG. 4 is a flowchart of the continuous signal discrimination process in the signal correction circuit 6 in Embodiment 1.

FIG. 4 shows a flowchart of the continuous signal discrimination processing in the signal correction circuit 6.

In the continuous signal discrimination processing, it is determined whether the signal received is a continuous signal or a tone signal according to the envelope-signal psd sent from the receiving circuit 3, and if the signal is continuous signal, a variable "continue" is set to '1'.

First, when a psd-signal sent from the receiving circuit 3 is '0' (step S1), '0' is set in the variable "continue" (step S2) by the processing loop L1. Next, when '1' is set in the psd-signal because the receiving circuit 3 has received a continuous signal (step S1), the variable "continue" is checked to determine its value (step S3). In this case, because '0' is set in the variable "continue" by the processing loop L1, the variable count3 is initialized to '0' (step S4). The signal correction circuit 6 thus determines whether the signal received is a continuous signal by carrying out steps S3 and S4 and the processing loop L2 (steps S5, S6, S7).

That is, if Tcont is used as the threshold value, if the envelope-signal psd is reset to '0' before the variable count3 is incremented and reaches Tcont, it is recognized that the signal received is not a continuous signal (step S5), and the processing returns to the initial step (step S2) as indicated by the return loop R1. On the other hand, if the level of the envelope-signal psd continues to be set at '1' until the value of the variable count 3 reaches the threshold value Tcont (step S7), it is determined that the signal received is continuous signal, and the variable "continue" (step S8) is set to '1'. Here, the threshold value Tcont is selected to be longer than Tc (for example, 3×Tc) so that the tone signal may not be erroneously recognized as continuous signal.

When the variable "continue" is set to '1', steps in the processing loop L3 are continued so long as the psd-signal remains at '1'.

Figure 5:
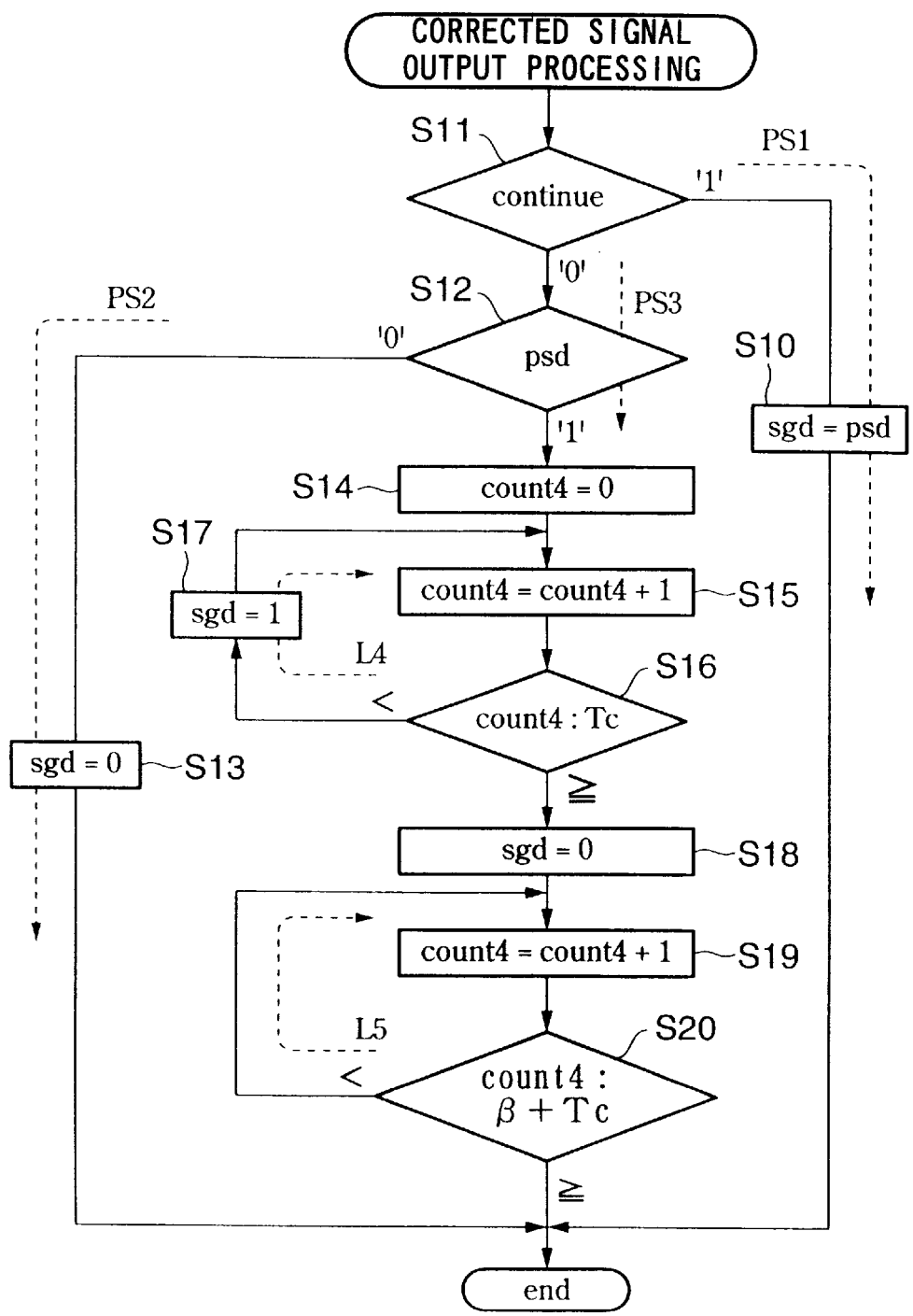
FIG. 5 is a flowchart of the corrected signal output processing in the signal correction circuit 6 in Embodiment 1.

Next, FIG. 5 shows a flowchart for the corrected signal output processing in the signal correction circuit 6.

The corrected signal output processing outputs sgd-signals with correction added so long as the tone-signals are being received, but if the continuous signals are received, the psd-signals sent from the receiving circuit 3 are output without any correction as sgd-signals.

If the ports are not connected to each other, because the envelope-signals psd and the variable "continue" are both reset to '0', sgd-signal is reset to '0' in the processing path PS2 (steps S11–S13).

On the other hand, if a tone-signal is being received, the variable "continue" is reset to '0' and the envelope-signal psd is set to '1' (step S11, S12, S14). Here, the processing loop 14 guarantees that the interval during which the sgd-signal is maintained at '1' will not exceed Tc (step S15–S17). Also, the processing loop L5 guarantees that the interval for resetting sgd-signal to '0' will not exceed the interval $\beta$ (step S18–S20).

Accordingly, when the signal correction circuit 6 in the present embodiment determines that the envelope-signal psd sent from the receiving circuit 3 is set to '1', the signal correction circuit 6 generates a correction signal in such a way that sgd-signal will be set to '1' for a specific duration (interval Tc), and subsequently, sgd-signal will continue to be reset to '0' for a specific duration (interval β). By so doing, even when an envelope-signal psd having a pulse width wider than the interval Tc is output from the receiving circuit 3, sgd-signal having a pulse width limited to Tc can be input in the connection state managing machine 5.

In other words, so long as the tone-signals are being received, envelope-signals psd output from the receiving circuit 3 are replaced with corrected signals having a pulse width that is equal to or less than the pulse width of the tone-signal. Therefore, once the connection state managing machine 5 has reset a latched sdd-signal to '0' after the interval Tc (which is the pulse width of the tone-signal), the connection state managing machine 5 will not again mistakenly latch an sgd-signal (that is set to '1') as an sdd-signal (that is set to '1') within the time interval of the same tone signal (i.e., the first rise and the last fall of a tone signal). Also, by preventing the same tone-signal to cause latching twice, it is possible to prevent a tone-signal to be mistaken for a continuous signal, thereby enabling to maintain the port in the suspended state.

[Embodiment 2]

In Embodiment 1 presented above, received signals are replaced with corrected signals which are maintained at '1' for a specific duration (interval Tc) and are reset to '0' for a specific subsequent duration β. However, it is possible to utilize an integration circuit and a comparison circuit to alter the pulse width of a received signal so as to prevent erroneous action of the connection state managing machine 5.

Figure 6:
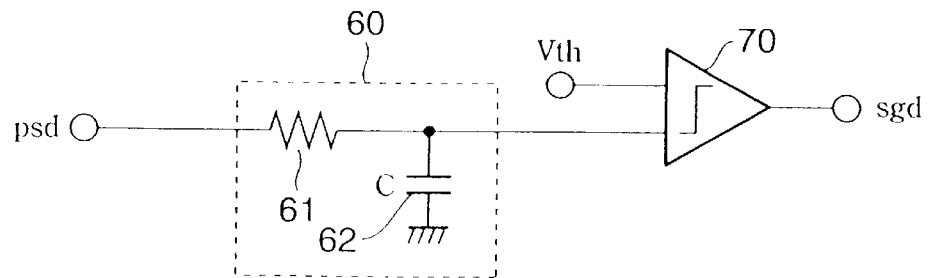
FIG. 6 is a schematic circuit diagram of the signal correction circuit 6 in a connection control circuit in Embodiment 2.

FIG. 6 shows a schematic circuit diagram of a signal correction circuit in the connection control circuit in Embodiment 2.

The connection control circuit (port) in Embodiment 2 is obtained by replacing the signal correction circuit 6 in FIG. 1 with a comparison circuit 70 and an integration circuit 60 comprised by a resistor 61 and a condenser 62. In such a configuration of the signal correction circuit 6, an envelope-signal psd of a rectangular waveform sent from the receiving circuit 3 is processed through the integration circuit 60 to delay the rise and fall times to generate a triangular waveform signal, and the comparison circuit 70 generates a signal having a desired pulse width in accordance with the triangular waveform signal.

Figure 7:
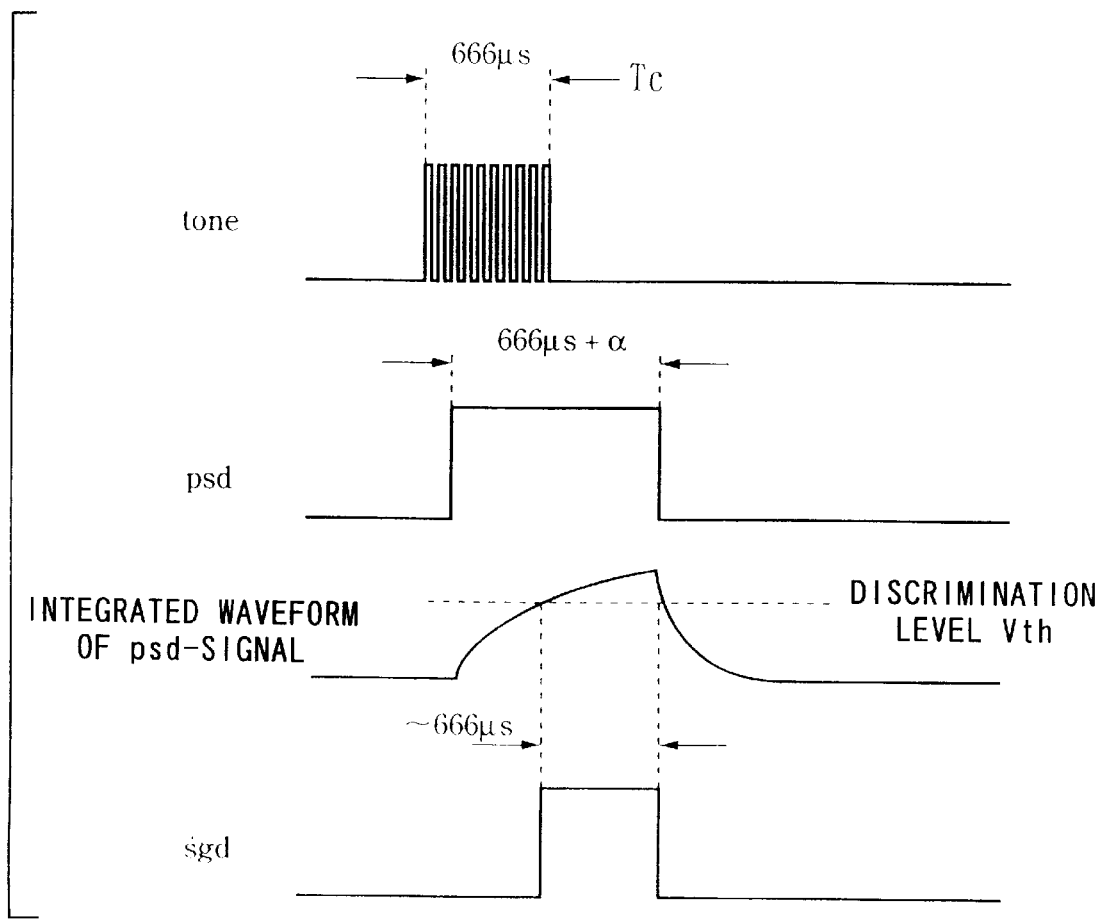
FIG. 7 is an illustration of the waveforms of the signals in Embodiment 2.

The process will be described in more detail below. When the signal correction circuit 6 of such a configuration is used, the receiving circuit 3, upon receiving a tone-signal having a pulse width Tc (666 μs for example) as shown by the waveform shown in FIG. 7, outputs an envelope-signal psd having a pulse width Tc+α. The integration circuit 60 moderates the slope of the rise and fall edges of the envelope-signal psd. Therefore, the output signal of the integration circuit 60 is input in the comparison circuit 70 having a threshold value Vth to generate a shaped sgd-signal having a pulse width that is equal to or less than the interval Tc, and this shaped sgd-signal is output to the connection state managing machine 5.

[Embodiment 3]

In the examples presented in Embodiment 1 and 2, envelope-signals sent from the receiving circuit 3 are corrected in the signal correction circuit 6, and the corrected signals (i.e., sgd-signal) are sent to the connection state managing machine 5 to prevent its erroneous action. However, it is possible to send the envelope-signals psd output from the receiving circuit 3 directly to the connection state managing machine 5, and alter the processing steps of the connection state managing machine 5 to prevent its erroneous action.

Figure 8:
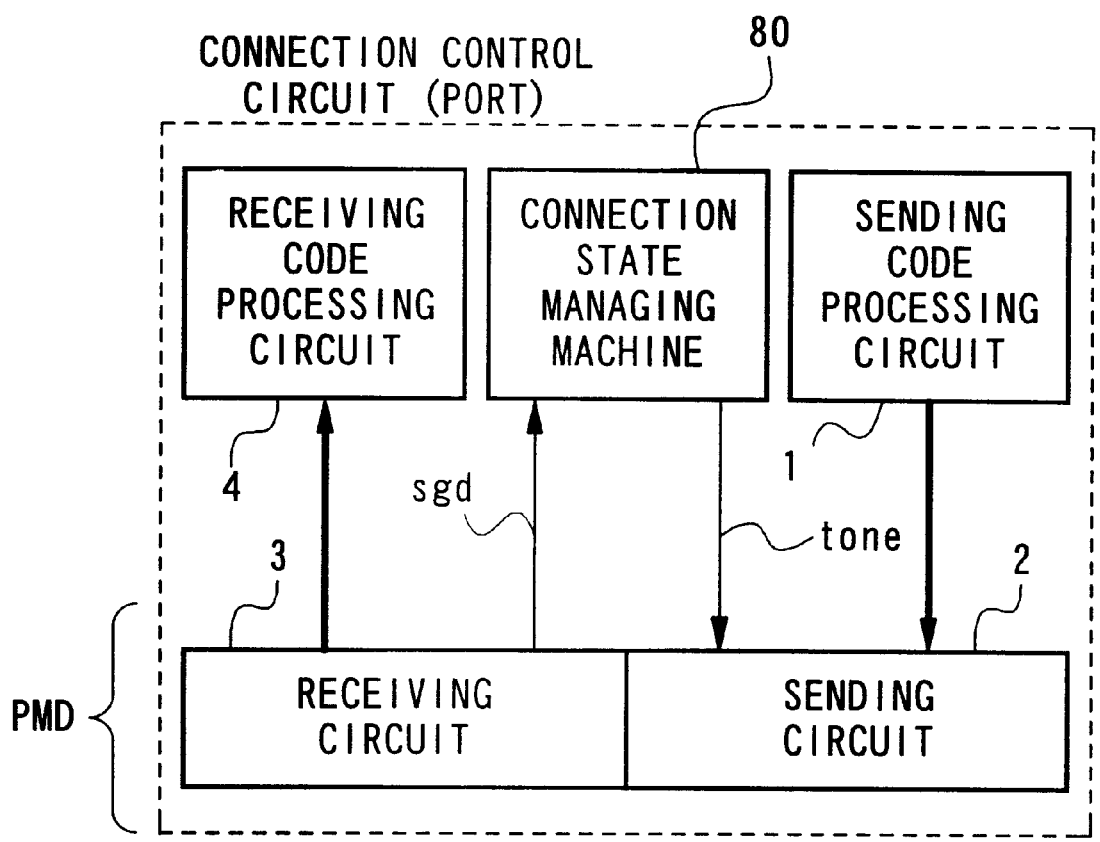
FIG. 8 is a block diagram of a configuration of a connection control circuit in Embodiment 3 of the present invention.

FIG. 8 shows a block diagram of a connection control circuit in Embodiment 3. The connection control circuit (port) in Embodiment 3 is obtained by eliminating the signal correction circuit 6 shown in FIG. 1 to produce a modified connection state managing machine 80. That is, sgd-signal output from the receiving circuit 3 is input directly in the connection state managing machine 80.

Figure 9A:
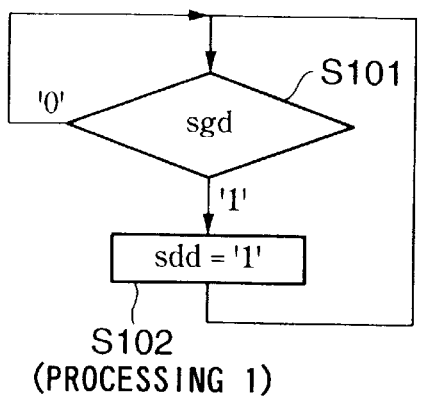
FIGS 9A and 9B are flowcharts of the process carried out by the connection state managing machine 80 in Embodiment 3.
Figure 9B:
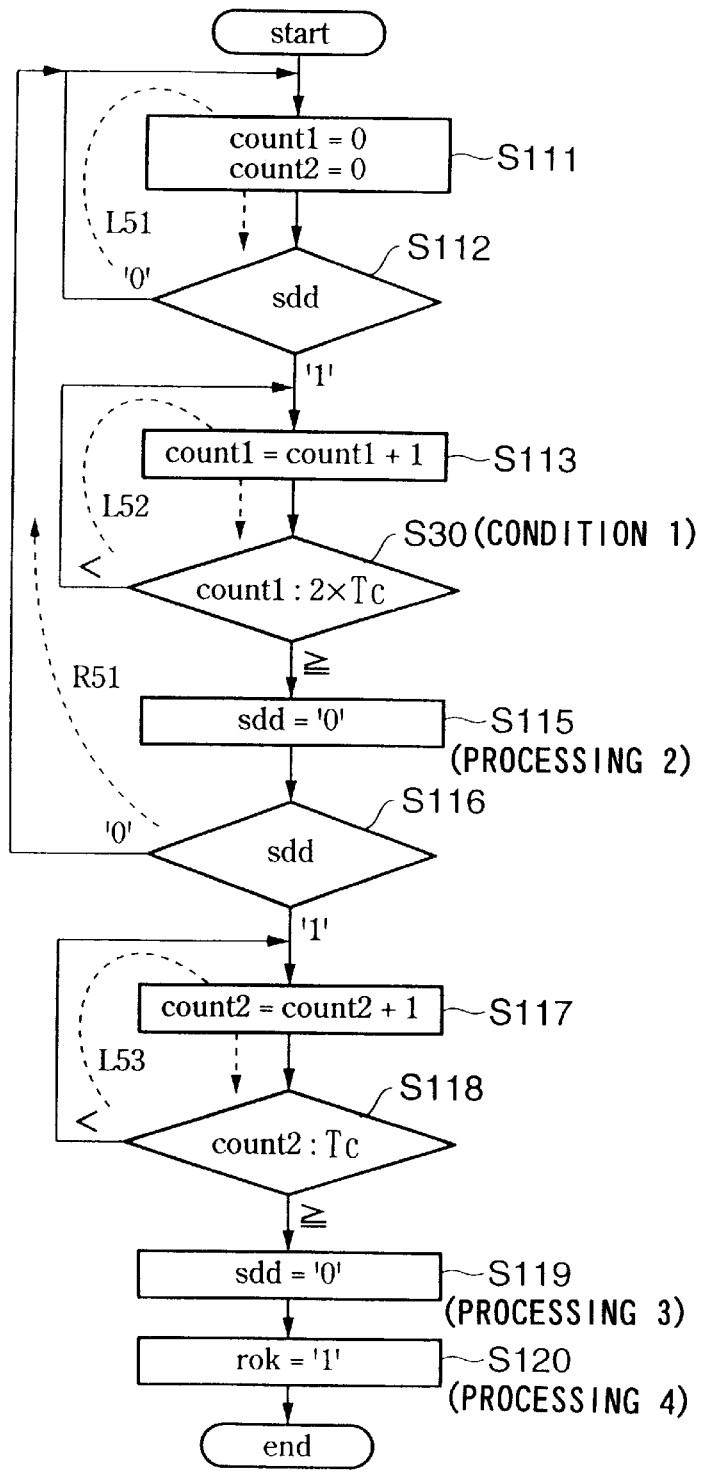

FIGS. 9A and 9B show flowcharts of the process in the connection state managing machine 80.

Processing steps in the connection state managing machine 80 can be represented by replacing the step 114 (FIG. 15B) in the connection state managing machine 5 with step S30 in the connection state managing machine 80. That is, in the process shown in FIG. 15B, the tone-signal is processed according to condition 1 (step S114) to match the pulse width of the sgd-signal with the interval Tc in the processing loop L52. In contrast, the cycling duration in Embodiment 3 is increased to 2×Tc in step S30, as an example.

The operation of the connection state managing machine 80 will be explained in detail.

Figure 10:
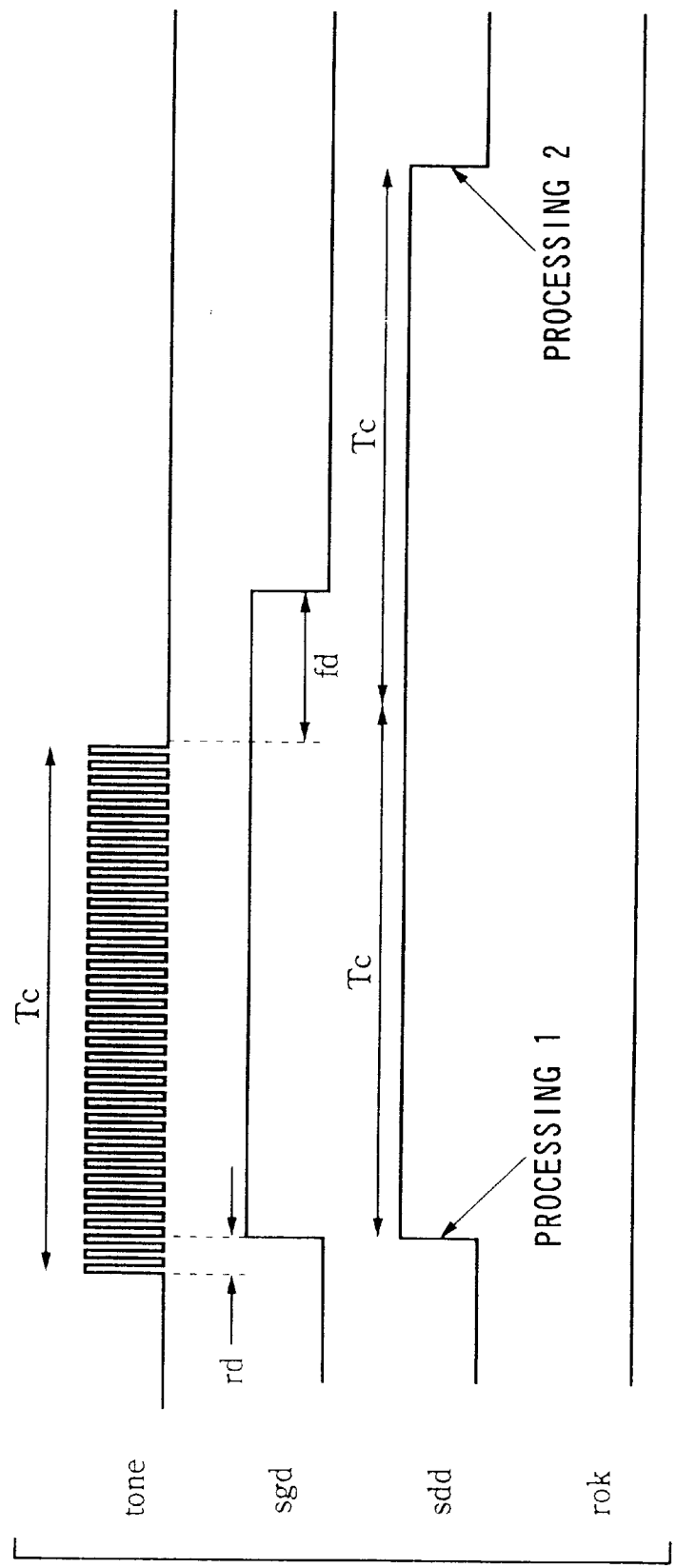
FIG. 10 is an illustration of the waveforms of the signals in the operation of Embodiment 3.

As shown in FIG. 10, when a tone-signal having a pulse width Tc is input in the receiving circuit 3, it is assumed that the fall delay fd is larger than the rise delay rd in the sgd-signal output from the receiving circuit 3.

When the sgd-signal is set to '1' (step S101), sdd-signal is set to '1' by processing 1 shown in FIG. 9A (step S102). When the sdd-signal is set to '1' (steps S111, S112), it is held to '1' by the processing loop L52 (steps S113, S30) until an interval 2×Tc is reached, and subsequently, processing 2 resets the sdd-signal to '0' (step S115). At this point, the sgd-signal is already at '0' so that no sdd-signal can be set to '1' again within the same tone-signal.

In this embodiment, the holding interval in the processing loop L52 is continued to 2×Tc, but it is permissible to use other values that are wider than the pulse width of the sgd-signal.

The connection state managing machine 80 carries out a process so that, when the first signal, i.e., envelope-signal psd, from the receiving circuit 3 is set to '1', it latches the signal-psd to generate a second signal, i.e., sdd-signal (='1'), as indicated in FIG. 9A, and the latched second signal is reset to '0' after a time interval that is longer than the pulse width of the envelope-signal output from the receiving circuit 3, as indicated in FIG. 9B. Accordingly, it is possible to prevent erroneous action of the connection state managing machine, without having the signal correction circuit 6 to correct the signals sent from the receiving circuit 3. That is, because it is possible to prevent sgd-signals to be latched twice within a given envelope-signal of the tone-signal, a tone-signal cannot be mistaken as a continuous signal and the port can be maintained in the suspended state.

What is claimed is:

1. A connection control circuit for controlling a connection between opposing devices comprising:
   an envelope-signal generation section for generating an envelope-signal in accordance with an incoming signal sent from a device at an opposing end of a transmission line;
   a discrimination section for discriminating, based on said envelope-signal, whether said incoming signal is a continuous signal or a connection managing signal by referencing a specific discrimination interval that is longer than a pulse width of the connection managing signal; and a connection managing section for shifting a state of said connection control circuit according to a type of incoming signal determined by said discrimination section.

2. A connection control circuit according to claim 1, further comprising:

a receiving section for receiving said incoming signal sent through said transmission line; and a signal correction section for correcting said envelope-signal so that, when said discrimination section determines that said incoming signal is a connection managing signal, a pulse width of a corrected envelope-signal output from said signal correction section will be not more than said pulse width of said connection managing signal input into said receiving section, said corrected envelope signal being inputted into said connection managing section; wherein said specific discrimination interval that exceeds said pulse width of said connection managing signal input in said receiving section is defined as a first constant time interval.

3. A connection control circuit according to claim 2, wherein said discrimination section measures a time interval during which said envelope-signal is set to a first specific level, and when a measured time interval at said first specific level continues longer than said first constant time interval without interruption, it is determined that said incoming signal is a continuous signal, and when said measured time interval at said first specific level is terminated in a lesser interval, it is determined that said incoming signal is a connection managing signal; and when said discrimination section determines that said incoming signal is a connection managing signal, said signal correction section generates said corrected envelope-signal so that said first specific level is maintained until a second constant time interval is reached and, subsequently, said first specific level is reset to a second specific level and is maintained for a third constant time interval.

4. A connection control circuit according to claim 2, wherein said signal correction section includes:

an integration section for delaying rise and fall times of a pulse of an input signal; and a comparison section for comparing a level of a signal output from said integration section with a threshold voltage level to generate a modified signal having a specific pulse width, wherein said signal correction section performs waveform shaping of said envelope-signal output from said envelope-signal generation section so as to output said corrected envelope signal having a modified pulse width.

5. A connection control circuit according to claim 1, wherein said envelope-signal generation section includes:

a receiving section for receiving said incoming signal from said transmission line and outputting said generated envelope-signal for said incoming signal; and said discrimination section includes:

a latching section for latching said envelope-signal that is set to a specific level to generate a latched signal; and a reset section for resetting said latched signal after waiting for said specific discrimination interval from the instant of latching said envelope-signal; wherein said specific discrimination interval is defined as a duration that is longer than a maximum value of a pulse width of said envelope-signal output from said receiving section when said received incoming signal is a connection managing signal.

6. A connection control circuit according to claim 5, wherein said discrimination section is provided within said connection managing section.

7. A connection control circuit according to claim 1, wherein said envelope-signal generation section outputs received incoming signals in addition to said envelope-signal;

said connection managing section outputs a connection managing signal to be sent to said device at the opposing end of said transmission line, and said connection control circuit further includes:

a sending code processing section for coding signals sent from an upper layer device;

a sending section for sending signals sent from said sending code processing section or connection managing signals sent from said connection managing section to said transmission line; and a receiving code processing section for coding received signals output from said envelope-signal generation section and transmitting coded signals to said upper layer device.

* * * * *